(12) United States Patent
Mori

(10) Patent No.: US 6,597,300 B2
(45) Date of Patent: Jul. 22, 2003

(54) DIGITAL-ANALOG CONVERTING CIRCUIT

(75) Inventor: Hiroyuki Mori, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 09/871,825

(22) Filed: Jun. 4, 2001

(65) Prior Publication Data

US 2002/0039075 A1 Apr. 4, 2002

(30) Foreign Application Priority Data

Sep. 29, 2000 (JP) ...................................... 2000-297839

(51) Int. Cl.[7] ................................................ H03M 2/66
(52) U.S. Cl. .......................... 341/144; 341/118; 341/120
(58) Field of Search ................................. 341/118, 120, 341/144

(56) References Cited

U.S. PATENT DOCUMENTS

| | | | | |
|---|---|---|---|---|
| 4,975,699 A | * | 12/1990 | Frey | 341/118 |
| 5,894,280 A | * | 4/1999 | Ginetti et al. | 341/118 |
| 6,278,391 B1 | * | 8/2001 | Walker | 341/118 |
| 6,281,818 B1 | * | 8/2001 | Miller | 341/120 |
| 6,313,769 B1 | * | 11/2001 | Mangahas et al. | 341/118 |

FOREIGN PATENT DOCUMENTS

| | | | | |
|---|---|---|---|---|
| JP | 11-234130 | 8/1999 | | |
| JP | 11234130 A | * 8/1999 | ............ | H03M/1/10 |

OTHER PUBLICATIONS

Jacob Millman, "Digital and Analog Circuits and Systems" p. 569–573, 1979.*

* cited by examiner

*Primary Examiner*—Michael Tokar
*Assistant Examiner*—Khai M. Nguyen
(74) *Attorney, Agent, or Firm*—Rabin & Berdo, P.C.

(57) ABSTRACT

A DA converting circuit comprises a first DA converter (12) for outputting an analog voltage corresponding to a value of a digital input signal, and a calibration mechanism (11, 13, 14, 15, 16 and 17) for generating a correction signal to cancel an offset related to a conversion operation by the converter. The calibration mechanism includes a correction value setting section (14, 15 and 16) for generating a digital correction value to cancel an offset, a second DA converter (17) to convert the digital correction value generated in the correction value setting section into an analog voltage, and an analog adder (13) to add together an analog voltage supplied by the second converter and an analog voltage supplied by the first converter, and outputs an analog output signal value representing the result of addition.

13 Claims, 5 Drawing Sheets

DIGITAL-ANALOG CONVERTING CIRCUIT

BACKGROUND OF THE INVENTION

1. Field of the Invention

The present invention relates to a digital-to-analog converting circuit (hereinafter referred to also as a digital-analog converting circuit or DA converting circuit), and more particularly to a DA converting circuit having an offset canceling function to correct an offset of analog output voltage due to a bias of the characteristics of the DA converting circuit itself, namely, a self-calibration function.

2. Related Art

As literature concerning the prior art in the above-mentioned field, there is Japanese Patent Application Laid-Open No. 11-234130.

FIG. 2 is a block diagram of a conventional DA converting circuit 100 disclosed in the above-mentioned literature.

A DA converting circuit 100 includes a selector (SEL) 1. The output terminal of the selector 1 is connected to the first input terminal of a digital adder (ADD) 2, which has two input terminals. The selector 1, according to a mode signal (MOD), selects a digital input signal (IN) as a digital signal to be converted into an analog output voltage or a fixed data (FD) as a digital signal having a fixed value, and outputs it to the digital adder 2.

The output terminal of the digital adder 2 is connected to the input terminal of a digital-to-analog converter 3 (hereafter referred to as "DAC") to convert a digital signal to an analog voltage. The output terminal of the DAC 3 is connected to a non-inverting input terminal of an operational amplifier (AMP) 4 as a component part of a buffer circuit. The operational amplifier 4 outputs an analog output signal (OUT) and part of the analog signal is fed back to an inverting input terminal of the operational amplifier 4. The operational amplifier 4 functions as a buffer circuit to prevent effects of noise from the circuit of the output terminal that receives the analog output.

In an operation of the DA converting circuit 100, a digital input signal (IN), while passing through the component parts mentioned above, is converted into an analog voltage, and the analog voltage as an outcome of the conversion is output as an analog output signal (OUT) from the operational amplifier 4.

To calibrate the analog output signal (OUT), the DA converting circuit 100 is configured as follows.

The analog output signal (OUT) from the operational amplifier 4 is applied to the first input terminal of a comparator (COMP) 5. A reference voltage (VC) at an analog voltage value corresponding to the digital value of the fixed data (FD) is applied to the other (second) input terminal of the comparator 5. The comparator 5 compares the analog output voltage (OUT) and the reference voltage (VC) applied to the input terminals thereof and outputs a binary signal, that is, a digital signal representing the result of comparison. The output terminal of the comparator 5 is connected to input terminals of a counter (CNT) 6 and a register latch (REG) 7. The counter 6 counts up an estimated offset value one-by-one at fixed time intervals to obtain offset values of the analog output signal (OUT), and successively outputs the estimated offset values to the register latch 7. The register latch 7 applies the estimated offset value from the counter 6 to the second input terminal of the digital adder 2, and stores as an offset value an estimated offset value when the result of comparison from the comparator 5 is inverted.

In the calibration prior to an ordinary conversion operation in the DA converting circuit 100, the following operation takes place.

When a mode signal (MOD) specifying that an operation be performed in the offset value measuring mode is supplied to the selector 1, a digital value corresponding to the reference voltage (VC) applied to the comparator 5 is input as fixed data (FD) of eight bits, for example, to the first input terminal of the digital adder 2. In this case, for example, ½ of the analog power supply voltage (Vcc) is supplied as the reference voltage (VC), and 7Fh (h indicates hexadecimal notation and 7Fh means an intermediate value) is supplied as a digital value.

At this time, the counter 6 outputs an 8-bit digital signal corresponding to 80h as an initial value of an estimated offset value to the register latch 7. The register latch 7 stores this estimated offset value, and outputs this estimated value to the digital adder 2.

When receiving the estimated offset value from the register latch 7 at its second input terminal, the digital adder 2 adds the estimated value and the value of fixed data supplied from the selector 1. When the result of addition is sent from the digital adder 2 to the DAC 3, a digital signal representing the result of addition is converted by the DAC 3 into an analog voltage, and the operational amplifier 4 outputs it as an analog signal OUT. The analog signal OUT, as mentioned above, is input to the comparator 5 and is compared with the reference voltage (VC), and a binary signal representing the result of comparison is output to the counter 6 and the register latch 7.

After this, an estimated offset value that is output from the counter 6 is counted up by addition of ones and zeros from 80h to a maximum of 7Fh at fixed time intervals. Consequently, as the result of addition at the digital adder 2, by which the digital input to the DAC 3 increases gradually, the analog output signal (OUT) increases. When the analog output signal (OUT) exceeds the reference voltage (VC), a binary signal, representing the result of comparison output from the comparator 5, is inverted. The register latch 7 stores as an offset value an estimated offset value when the binary signal is inverted.

When the offset value has been set, to proceed from the calibration to an ordinary conversion operation, a mode signal (MOD), which specifies the DA conversion mode for a conversion operation, is supplied to the selector 1. In response to what is specified by the mode signal (MOD), the digital input signal (IN) is applied to the first input terminal of the digital adder 2. At this time, the register latch 7 outputs to the digital adder 2 as a correction value the offset value measured in the offset measuring mode. The digital input signal (IN) is added with the correction value, and converted by the DAC 3 into an analog voltage, which is output by the operational amplifier 4 as an analog output signal (OUT).

As has been described, in the conventional DA converting circuit 100, before performing an ordinary DA conversion operation, an offset value is measured, in other words, a calibration is carried out. By this calibration, an offset value is measured, which makes it possible to appropriately output an analog voltage that has a similar value to the reference voltage (VC) corresponding to a digital signal IN. This offset value is stored in the register latch 7. In an ordinary DA conversion, the stored offset value is added as a correction value to a digital input signal IN. Therefore, according to a conventional DA converting circuit 100, offsets that are liable to occur in the DAC 3 and the operational amplifier 4 can be cancelled in an ordinary DA conversion.

A conventional DA circuit, however, has a problem as follows.

As described above, a conventional DA circuit 100 includes a digital adder 2 to add an 8-bit digital signal IN and an 8-bit offset value, and a DAC 3 to convert a result of addition by the digital adder into an analog voltage. In such a circuit configuration, if for example a permissible number of digits in conversion at the DAC 3 is eight bits, the same as the number of digits of a digital signal IN, then if the DAC 3 receives a digital signal of nine bits produced by a carry from a result of addition in the digital adder 2, an overflow occurs, with the result that precision decreases in conversion to an analog output voltage.

Therefore, an object of the present invention is to provide a DA converting circuit capable of avoiding a drop in conversion precision ascribable to an overflow in the DA converter.

SUMMARY OF THE INVENTION

According to an aspect of the present invention, a digital-to-analog converting circuit comprises a first digital-to-analog converter for outputting an analog voltage corresponding to a value of a digital input signal (IN), and a calibration mechanism for generating a correction signal to eliminate an offset related to a conversion operation of the converter, the calibration mechanism comprises a correction value setting section for generating a digital correction signal (CAL) to eliminate the offset, a second digital analog converter for converting the digital correction signal generated by the correction value setting section into an analog voltage, and an analog adder for adding the analog voltage output from the second converter and the analog voltage output from the first converter, and outputting a digital-to-analog-converted value representing a result of addition.

According to another aspect of the present invention, the calibration mechanism may further comprise a first selector for selectively inputting the digital input signal or a data signal (FD) for performing a calibration to generate the digital correction signal to the first digital-to-analog converter, the correction value setting section may comprise a comparator for, when the data signal is selected by the first selector, comparing output values from the analog adder with a reference value, and outputting comparison results sequentially, a register for storing the plurality of comparison results from the comparator, and a controller (16) for sequentially transferring a plurality count signals, instead of the correction signal, having progressively increasing or decreasing value to the second digital analog converter.

According to a further aspect of the present invention, in performing the calibration, the register may sequentially store comparison results according to the count signals, and the controller may obtain a correction value to eliminate the offset based on the count values when the comparison results stored in the register change, and in the conversion operation such that the digital input signal is selected by the first selector, may output a digital signal having the correction value as the correction signal to the second digital-to-analog converter.

According to yet another aspect of the present invention, the calibration mechanism may further comprise a second selector, located between the controller and the second digital-to-analog converter, selectively outputting the digital correction signal from the controller or an external digital correction signal input from outside as the correction value to the second digital-to-analog converter, and in the conversion operation, the second selector selects either the correction signal or the external correction signal.

According to a still further aspect of the present invention, the calibration mechanism may further comprise a second selector for selectively outputting a first digital supplementary signal input from outside to modify the digital correction signal or a second digital supplementary signal having a value different from the first supplementary signal, and may comprise a digital adder, located between the controller, the second selector and the second digital-to-analog converter, for adding a digital output value from the second selector and a digital output value from the controller, and for outputting a result of the addition to the second digital-to-analog converter.

According to a still other aspect of the present invention, the digital adder, during the calibration, may sequentially output a result of addition of each value of the plurality of count signals and the value of the first supplementary signal to the second converter, and when correcting the value of the digital correction signal, may output a result of addition of the value of the correction signal and the value of the second supplementary signal to the second converter.

According to an additional aspect of the present invention, the first digital supplementary signal (FX) may have a value of level "0" to substantially invalidate the addition function of the digital adder, and the second digital supplementary signal (DTO) may have a value to finely adjust the value of the digital correction signal.

According to another aspect of the present invention, the analog adder may output an analog reciprocal or differential value, reciprocal to the result of addition at the analog adder, as the reference value to the comparator with outputting the result of addition, the reciprocal value of the analog adder in the calibration changes reciprocally to change the analog calculation result, and the comparator may output comparison results between a plurality of the addition results having progressively decreasing or increasing value and a plurality of reciprocals of the addition results that change reciprocally to the addition results.

DESCRIPTION OF PREFERRED EMBODIMENTS

Embodiment 1

Figure 1:
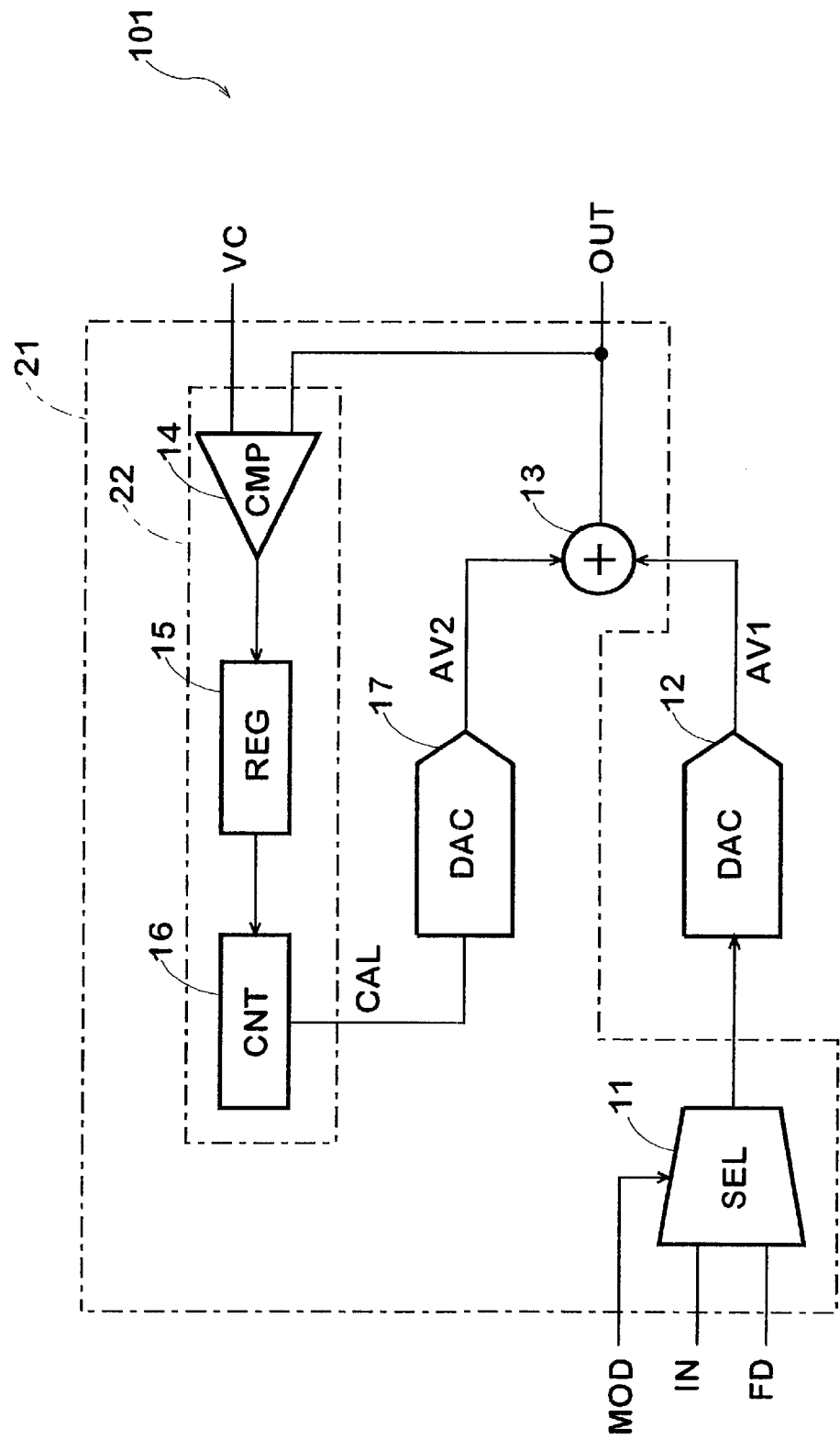
FIG. 1 is a block diagram of a DA converting circuit 101 according to a first embodiment of the present invention.
Figure 2:
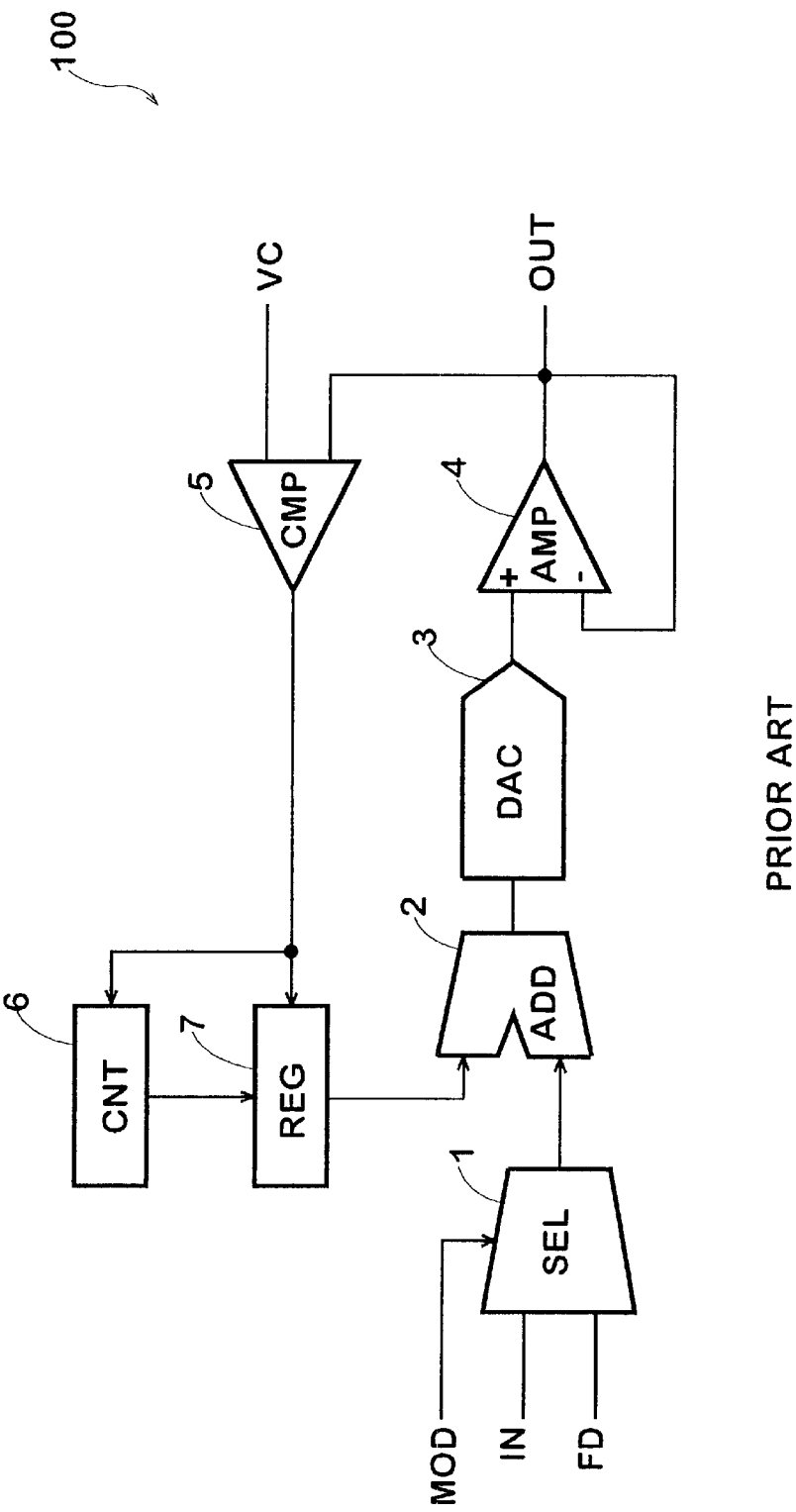
FIG. 2 is a block diagram of a conventional DA converting circuit.

FIG. 1 is a block diagram of a DA converting circuit 101 according to a first embodiment of the present invention. The DA converting circuit 101 has an offset canceling function for work to cancel an offset of analog output voltage due to a shift of its own characteristics, that is to say, for calibration work (calibration). The DA converting circuit 101, to perform the offset canceling function, calibrates analog output voltage before performing a DA conversion operation to convert a digital input signal into an analog output signal having a digital-to-analog conversion value.

As shown in FIG. 1, the DA converting circuit 101 includes a selector 11, and a DAC (digital-analog converter) 12 is connected to the selector.

The selector 11 selects an 8-bit digital input signal (IN) to undergo conversion and fixed data (FD) as an 8-bit digital signal to carry out the calibration according to a mode signal (MOD), and outputs it to the DAC 12. The digital input signal (IN) and the fixed data, each eightbits long as mentioned above, can each be displayed in 256 levels.

The DAC 12 can convert either one of the 8-bit digital signals, supplied selectively from the selector 11, into analog voltages (AV1) at levels from level "0" to level "255" to correspond to the value of an 8-bit digital signal.

The output terminal of the DAC 12 is connected to the input terminal of the analog adder 13. The analog adder 13 is formed by a well-known operational amplifier, and analog voltage values at the first and the second input terminals are added together. The analog voltage as a sum obtained in the analog adder 13 is output as an analog output signal (OUT) having the above-mentioned digital-to-analog conversion value to a circuit connected to the output terminal of the DA converting circuit 101.

The DA converting circuit 101 further includes still other component parts of a calibration mechanism 21 to carry out the offset canceling function, such as a comparator (CMP) 14, a register (REG) 15, a controller (CNT) 16, and a DAC 17, in addition to the selector 11 mentioned above. Among them, the comparator (CMP) 14, the register (REG) 15 and the controller 16 constitute a correction value setting section 22, which will be described later.

An analog output signal (OUT) from the analog adder 13 is given to the first input terminal of the comparator 14, and a reference voltage (VC) for carrying out the calibration is supplied to the second input terminal of the comparator 14. The comparator 14 compares the voltage values received at the first and the second input terminals, and outputs the result of comparison in the form of a binary signal to the register 15. In the first embodiment, as the analog reference voltage (VC) a voltage of, for example, ½ of the power supply voltage Vcc, is supplied. When the voltage at the first input terminal is lower than that of the second input terminal, in other words, when an analog output signal (OUT) is lower than the reference voltage (VC), the comparator 14 outputs, as the result of comparison, a digital signal representing level "L" to the register 15, or if the result of comparison is the opposite, the comparator 14 outputs a digital signal of level "H".

The controller 16 is connected to the output terminal of the register 15. The register 15 retains a digital signal value showing the result of comparison from the comparator 14.

The DAC (digital-to-analog converter) is connected to the output terminal of the controller 16. The controller 16, in the same way as in the prior art, counts up a digital value by addition of ones and zeros in the calibration work, which will be described later, and sequentially transfers the count values to the DAC 17. The controller. 16, after sending the count value to the DAC 17, compares signal values representing a plurality of comparison results held in the register 15, each one of them obtained for one count value, and obtains an offset value that the DA converting circuit 101 possesses in itself. In other words, from a number of output results of the comparator 14, the controller 16 obtains a transition digital value, which is a count value when the state is inverted between the adjacent binary digits representing the output results, and generates a suitable correction value (CAL) based on this transition digital value.

As the correction value (CAL), a difference between the above-mentioned transition digital value and a middle count value in a count-up range is adopted, for example, when fixed data FD is given the lowest level "0" of the above-mentioned count-up range and the reference voltage (VC) is given a half-value of Vcc (Vcc/2) as a middle value of the power supply voltage Vcc, which is the greatest analog output voltage value.

Further, as in a case where a fixed value FD is given a value of a middle level of the count-up range and the reference voltage is also given a half-value of Vcc (Vcc/2) as a middle value of the power supply voltage Vcc, if there is a correspondence relation between the fixed value FD and the reference voltage, a transition digital value mentioned above may be used as a correction value (CAL).

In an ordinary DA conversion after calibration, the controller 16 outputs this correction value to the DAC 17. Therefore, the comparator 14, the register 15 and the controller 16 constitute the correction value setting section 22 to set a correction value (CAL).

The output terminal of the DAC 17 is connected to the input terminal of the analog adder 13. The DAC 17, like the DAC 12, converts a digital signal of eight bits into an analog voltage. Therefore, the DAC 17 converts each count value from the controller 16 in calibration and a correction value in an ordinary operation into analog voltages, and outputs analog voltages as analog signals (AV2) to the analog adder 13.

The operation of the DA converting circuit 101 in the first embodiment will be described referring to operations in the setting mode (1) to set a correction value and in the conversion mode to perform an ordinary DA conversion (2).

(1) Setting Mode

In the setting mode of a correction value, a correction value (CAL) is set before performing a DA conversion of a digital input signal (IN) as the object of conversion.

When a mode signal (MOD) for entering the setting mode is input into the selector 1, the selector transmits fixed data (FD) to the input terminal of the DAC 12. In the first embodiment, as fixed data (FD), a digital signal representing level "0" is supplied. By supply of a digital signal of level "0", the analog voltage (AV1) of the DAC 12 falls to zero volts, so that an analog signal of zero volts is output from the DAC 12.

In calibration, the controller 16 counts up the value of the 8-bit digital signal, by-ones and zeros,from level "0" to "255". The value of a digital signal for each count-up is supplied one after another as a count value to the DAC 17. Therefore, the analog voltage (AV2) from the DAC 17 sequentially rises in 256 steps from 0 volt to Vcc as the count value increases.

The analog adder 13 sequentially adds an analog voltage AV1 at a fixed value, which does not increase, from the DAC 12 and an analog voltage AV2, which sequentially increases, from the DAC 17. Accordingly, the analog output signal (OUT) from the analog adder 13 rises one step at a time in 256 steps from 0 volt to Vcc as the measured value from the controller 16 increases.

As described above, the comparator 14 compares a progressively increasing analog output signal (OUT) from the analog adder 13 with the reference voltage (VC), and outputs a binary signal representing a result of comparison one after another. The values of this binary signal are sequentially stored in the register 15, which correspond to the count values output sequentially from the controller 16. The comparator 14 is supplied with a positive voltage value of Vcc/2 as the reference voltage (VC), as mentioned above, just after the start of calibration, more precisely, just after a correction value is set, the value of an analog output signal (OUT) from the analog adder 13 is substantially 0. For this reason, the comparator 14 outputs a signal of level "L". After this, if the analog signal sequentially rises and exceeds the reference voltage (VC=Vcc/2), the comparison result signal value obtained by the comparator 14 goes to level "H", and even if the analog output signal (OUT) further rises, the comparison signal level stays at level "H". Thus, 256 pieces of the binary signal value corresponding to the count values according to level "0" to level "255" are stored in the register 15.

When the 256 pieces of the comparison result signal are stored in the register 15, the controller 16 reads the contents of comparison results and detects a transition point where the comparison result signal changes from level "L" to level "H". As mentioned above, the controller 16 obtains a transition count value corresponding to the detected transition point, and then on the basis of the transition count value, generates a correction value (CAL). In a DA conversion after the calibration has been done, the controller 16 gives the correction value (CAL) to the DAC 17.

(2) Conversion Mode

After a correction value (CAL) for offset correction has been set in the setting mode, a digital input signal (IN) as an object of conversion is converted into an analog output signal (OUT) in the conversion mode, which is described below.

When the selector 11 is switched to the conversion mode by a mode signal (MOD), a digital input signal (IN) as the object of conversion is supplied to the input terminal of the DAC 12. The DAC 12 converts the digital input signal (IN) into an analog voltage (AV1) corresponding to the value of the digital input signal, and applies the analog voltage (AV1) to the first input terminal of the analog adder 13.

At this time, as mentioned above, the controller 16 gives the correction value (CAL), set in the setting mode described above, to the DAC 17. The DAC 17 generates an analog voltage (AV2) corresponding to a fixed correction value (CAL) obtained by the calibration work, and applies the voltage (AV2) to the second input terminal of the analog adder 13.

Consequently, the analog adder 13 adds the analog voltage (AV2) corresponding to the correction value (CAL) to the analog voltage (AV1) corresponding to the digital input signal (IN) as the object of conversion. The analog adder 13 outputs an analog output signal (OUT) in which the offset has been cancelled.

According to the DA converting circuit 101 of the first embodiment, by carrying out a calibration, offsets that occur in the DA converting circuit can be cancelled in a conversion operation after the calibration work has been completed.

Moreover, after each digital signal is converted by the respective DA converters into analog voltages, the values of the analog voltages are added together by the analog adder, so that a digital signal with a carry digit, which makes the signal's number of digits greater than the size when the digital signal was input, is prevented from being supplied to the DA converters.

Therefore, according to the DA converting circuit 101 of the present invention, it is not necessary to provide special DA converters that can handle a digital signal of a larger number of digits than the number of digits of digital signals as objects of conversion. Thus, by using analog adders generally available on the market, it is possible to prevent deterioration of the conversion precision of analog output voltages, which is attributable to an overflow of the DA converter caused by a carry from the most significant digit place of a digital signal.

Embodiment 2

Figure 3:
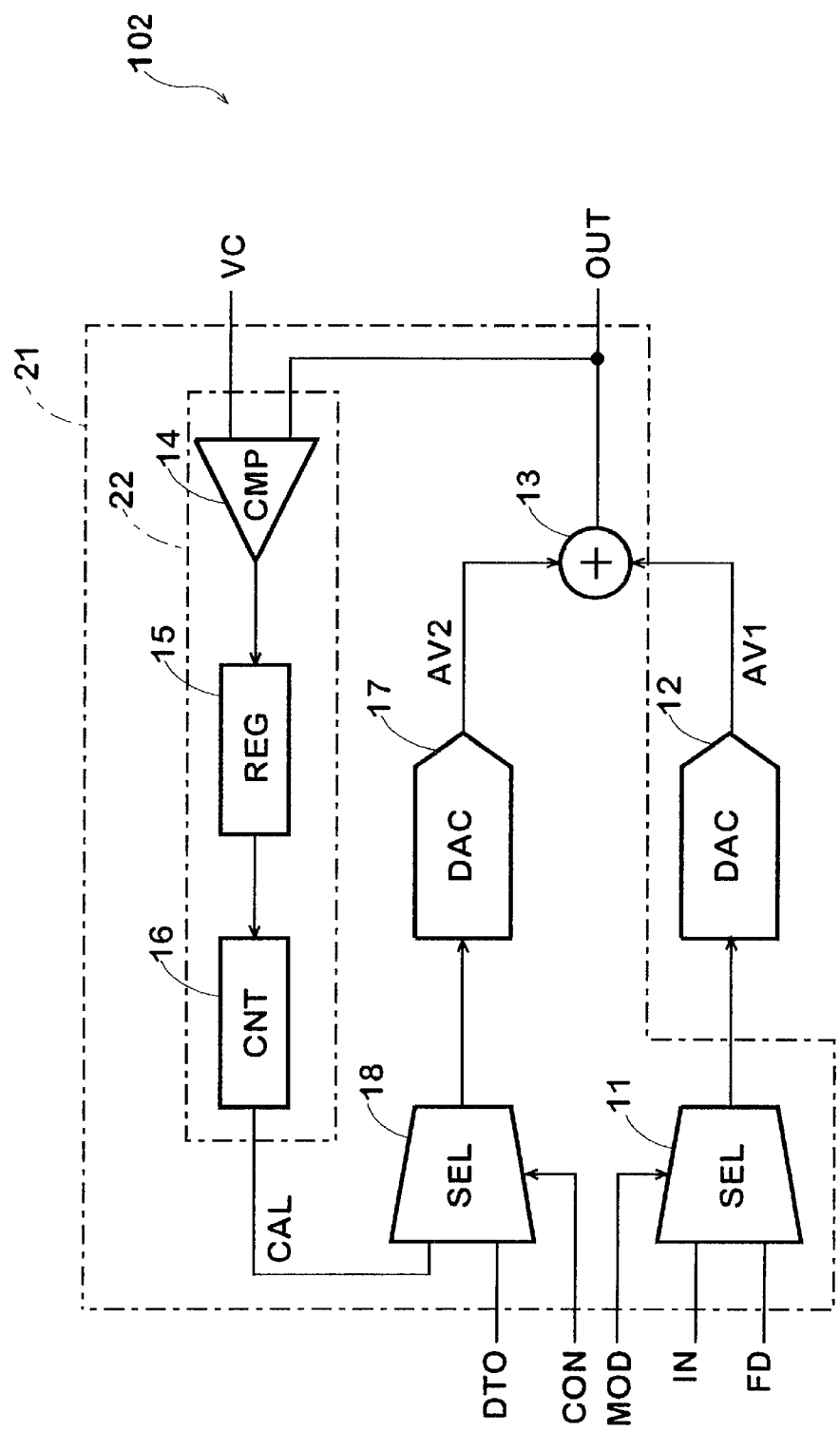
FIG. 3 is a block diagram of a DA converting circuit 102 according to a second embodiment of the present invention.

FIG. 3 is a block diagram of a DA converting circuit 102 according to a second embodiment of the present embodiment, and the parts that perform the same functions as the parts of the first embodiment shown in FIG. 1 are designated by the same reference numerals.

In a DA converting circuit 102, the calibration mechanism 21 of the DA converting circuit 101 in the first embodiment is added with a selector 18, which is located between the output terminal of the controller 16 and the input terminal of the DAC 17.

In response to a control signal (CON), the selector 18 selects either a correction value (CAL) supplied from the controller 16 for canceling an offset or external data (DTO), which will be described later and which is given from outside the DA converting circuit 102 for canceling an offset, and transfers the selected value or data to the DAC 17. The other parts of the DA converting circuit 102 are the same as those of the DA converting circuit 101 in the first embodiment shown in FIG. 1.

To perform the offset canceling function, the DA converting circuit 102 is provided with an outside control mode (3) in addition to the setting mode (1) to obtain a correction value internally and the conversion mode (2) which is the operation mode to carry out a DA conversion using a correction value, the latter two modes being provided also in the DA converting circuit 101 in the first embodiment.

An operation in the setting mode (1) is performed in the same way as in the DA converting circuit 101 in the first embodiment as the selector 11 outputs fixed data (FD) to the DAC 12 and the selector 18 sequentially outputs the count values to the DAC 17.

An operation in the conversion mode (2) subsequent to the setting mode (1) takes place as in the DA converting circuit 101 in the first embodiment as the selector 11 outputs a digital input signal (IN) to the DAC 12 and the selector 18 a correction value (CAL) to the DAC 17.

In the outside control mode (3), as a correction value for canceling an offset, external data (DTO), which, for example, is a digital signal that can be output from an outside processor for offset control, is used. The selector 18 performs a switching action to input the external data (DTO).

In the conversion mode (2) following the outside control mode (3), the selector 11 outputs a digital input signal (IN) to the DAC 12, and the selector 18 outputs external data (DTO) to the DAC 17.

Specifically, in the conversion mode (2) following the outside control mode (3), as mentioned above, because external data (DTO) is transferred from the selector 18 to the DAC 17, the external data is converted into an analog voltage (AV2) corresponding to the value of the data, and the analog voltage (AV2) is supplied to the second terminal of the analog adder 13.

On the other hand, because a digital input signal (IN) to be converted is supplied through the selector 11 to the input terminal of the DAC 12, the digital input signal (IN) is converted into an analog voltage (AV1), and the analog voltage (AV1) is applied to the input terminal analog adder 13

The two analog voltages (AV1, AV2) are added together by the analog adder 13. Consequently, an analog output signal (OUT), which has been cancelled by the external data (DTO) as a correction value, is output from the analog adder 13. In this manner, the DA converting circuit 12 performs a suitable DA conversion operation with offsets cancelled.

The DA converting circuit 102 according to the second embodiment, as described above, includes the selector 18 to selectively supply either a correction value (CAL) or external data (DTO) to the DAC 17 to cancel offsets.

According to the DA converting circuit 102, in addition to advantages offered by the DA converting circuit 101 in the first embodiment, there is another advantage that external data (DTO) can be used as correction values to cancel offsets.

In the DA converting circuit 102, after an offset value has been set by a calibration as mentioned above, if it changes with passage of time due to changes in environment temperature or noise, to carry out a calibration the same as mentioned above, it is possible to apply the setting mode (1) again. In performing a calibration, the DA converting circuit 102 obtains a new correction value (CAL) by using new count values from the controller 16, and by using the new correction value (CAL), carries out an accurate DA conversion operation again.

To update the correction value (CAL), if the setting mode (1) is entered in which count values are used, it is necessary to interrupt the DA conversion operation for a relatively long time.

In contrast, by entering the outside control mode (3) by using the selector 18, a new correction value can be obtained from outside by an instantaneous interruption of the DA conversion operation. For this reason, according to the DA converting circuit 102, even when it is necessary to update the offset correction value, this does not incur a substantial interruption but the accurate conversion operation can be continued.

Embodiment 3

Figure 4:
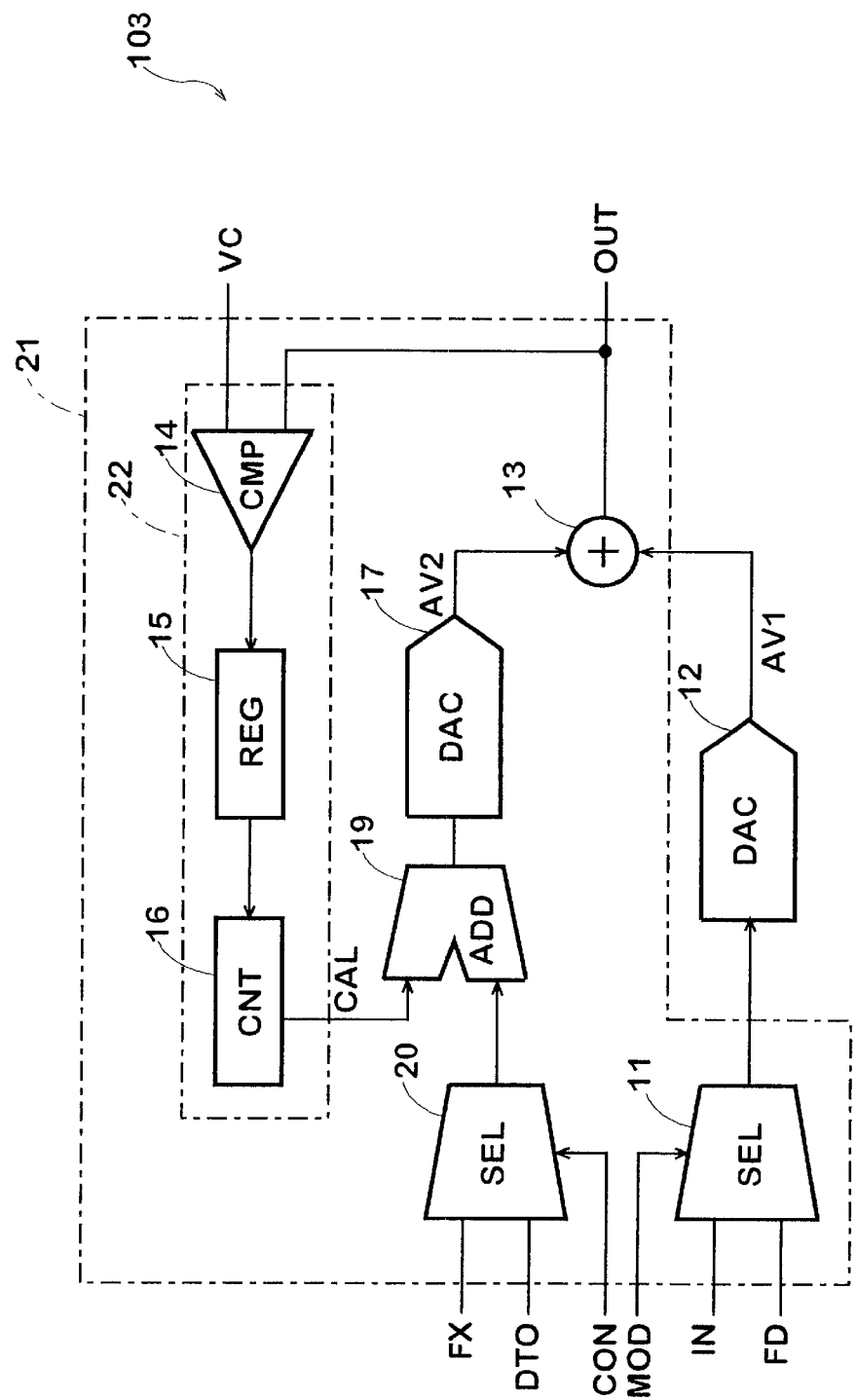
FIG. 4 is a block diagram of a DA converting circuit 103 according to a third embodiment of the present invention.

FIG. 4 is a block diagram of the DA converting circuit 103 according to a third embodiment of the present invention, and the parts that perform the same functions as the parts in the DA converting circuit 101 in the first embodiment shown in FIG. 1 are designated by the same reference numerals.

The DA converting circuit 103 is formed by adding a digital adder 19 and a selector 20 to the calibration mechanism 21 of the DA converting circuit 101. The digital adder 19 is located between the output terminal of the controller 16 and the input terminal of the DAC 17, and the output terminal of the selector 20 is connected to the first input terminal of the digital adder 19. The selector 20 has two input terminals through which mutually different digital values are input.

The selector 20 has its output terminal connected to the first input terminal of the digital adder 19. To modify a correction value (CAL), the selector 20, according to a control signal (CON), selectively outputs a first digital supplementary signal, or a second digital supplementary signal that has a value different from the value of the first digital supplementary signal.

The first digital supplementary signal is supplied as a fixed value FX (e.g., "0") to the selector 20 from outside of the DA converting circuit 103, and the second digital supplementary signal is supplied as external data (DTO) to the selector 20 from outside of the DA converting circuit 103.

The digital adder 19 receives at its second input terminal a count value or a correction value (CAL) from the controller 16. The output terminal of the digital adder 19 is connected to the input terminal of the DAC 17. The other parts of the DA converting circuit 103 are the same as those of the DA converting circuit 101 in the first embodiment shown in FIG. 1.

In order to perform the offset canceling function, the DA converting circuit 103 is provided with the outside control mode (3) to carry out a fine adjustment of the correction value (CAL) in addition to the setting mode (1) and the conversion mode (2).

In the setting mode (1), the selector 11 outputs fixed data (FD) to the DAC 12, and the selector 20 outputs a fixed value (FX) of level "0" to the digital adder 19. The digital adder 19 sequentially adds together one of the count values of level "0" to level "255", sequentially supplied from the controller 16, and the fixed value (FX). Consequently, a digital signal of level "0" to level "255" representing a result of addition, is sequentially output from the digital adder 19 to the DAC 17.

The subsequent operation following the described operation in the setting mode (1) is executed in the same manner as in the setting mode (1) in the DA converting circuit 101 in the first embodiment shown in FIG. 1. Therefore, a calibration using each of the count values of level "0" to "255" is carried out. Thus, because the fixed value input to the input terminal of the digital adder 19 is "0", in substantially the same way as in the second embodiment, a correction value (CAL) to cancel offsets of the DA converting circuit 103 can be determined.

In the conversion mode (2) following the setting mode (1), a digital input signal (IN) is output from the selector 11 to the DAC 12, and a fixed value (FX) of level "0" is output from the selector 20 to the digital adder 19.

The operation in the conversion mode (2) is carried out in the same manner as in the DA converting circuit 101 in the first embodiment except that a fixed value (FX) of the same value as was used in setting mode (1) is added to the correction value (CAL) output from the controller 16. Therefore, an analog output voltage (OUT) having an offset cancelled by an appropriate correction value (CAL) is output from the analog adder 13.

In the outside control mode (3), to finely adjust the correction value (CAL) set in the setting mode (1), external data (DTO) that can be supplied from an external processor for offset control, for example, is received as a digital signal for fine adjustment. The selector 20 performs a switchover action to receive external data (DTO) mentioned above. For external data (DTO) for fine adjustment, a very small digital value is selected so as not to incur an increase in the number of digits in a result of addition at the digital adder 19 caused by introduction of external data.

In the conversion mode (2) following the outside control mode (3), the selector 11 outputs a digital input signal (IN) to the DAC 12, the controller 16 outputs a correction value (CAL) to the digital adder 19, and the selector 20 outputs external data (DTO) to the digital adder 19.

The digital adder 19 adds the correction value (CAL) and the external data (DTO) together, and a digital signal (CAL) representing the result of addition is supplied to the DAC 17. Because the external data (DTO), as mentioned above, is a digital value so small as not to make the number of digits of the digital signal (CAL) representing the result of addition larger than the number of digits of correction value (CAL) before addition, an overflow does not occur at the DAC 17 even when a result of addition of external data (DTO) to the correction value (CAL) is given to the DAC 17.

The digital signal representing the result of addition is converted into an analog voltage (AV2), and the analog voltage (AV2) is output as an analog voltage for canceling offset to the analog adder 13. Thus, external data (DTO) is used as a correction value, and an analog output signal (OUT) having offset cancelled by it is output from the analog adder 13.

As described above, according to the DA converting circuit 103 in the third embodiment, in the setting mode (1), by selecting a fixed value (FX) of "0", a correction value (CAL) similar to that in the second embodiment can be selected. And in the outside control mode (3), by selecting external data (DTO), the correction value (CAL) can be adjusted to a fine degree without incurring a substantial interruption of the DA conversion operation. The external data (DTO) is supplied to the digital adder 19 by using the operation mode (2) as occasion requires, so that the correction value (CAL) is adjusted finely and a new correction value (CAL) can be obtained.

Therefore, according to the DA converting circuit 103 according to the third embodiment, in addition to the same advantages available with the DA converting circuit 101 in the first embodiment, there is another advantage. Specifically, when fine adjustment of the correction value (CAL) is required, without performing a calibration again using count values, the correction value (CAL) can be updated properly by supplying external data (DTO) to the digital adder 19 if necessary. For this reason, when the correction value (CAL) is updated, the DA conversion operation need not be stopped for a substantial interruption, but can be continued for better efficiency.

In the described case of the DA converting circuit 103, instead of adding a fixed value (FX) of level "0" to the digital adder 19, for a general shift-up of the count values, it is possible to input a very small value (FX), such as "1", which differs from the value of the external data (DTO) and which will not have any chance of producing a carry from any count value.

Embodiment 4

Figure 5:
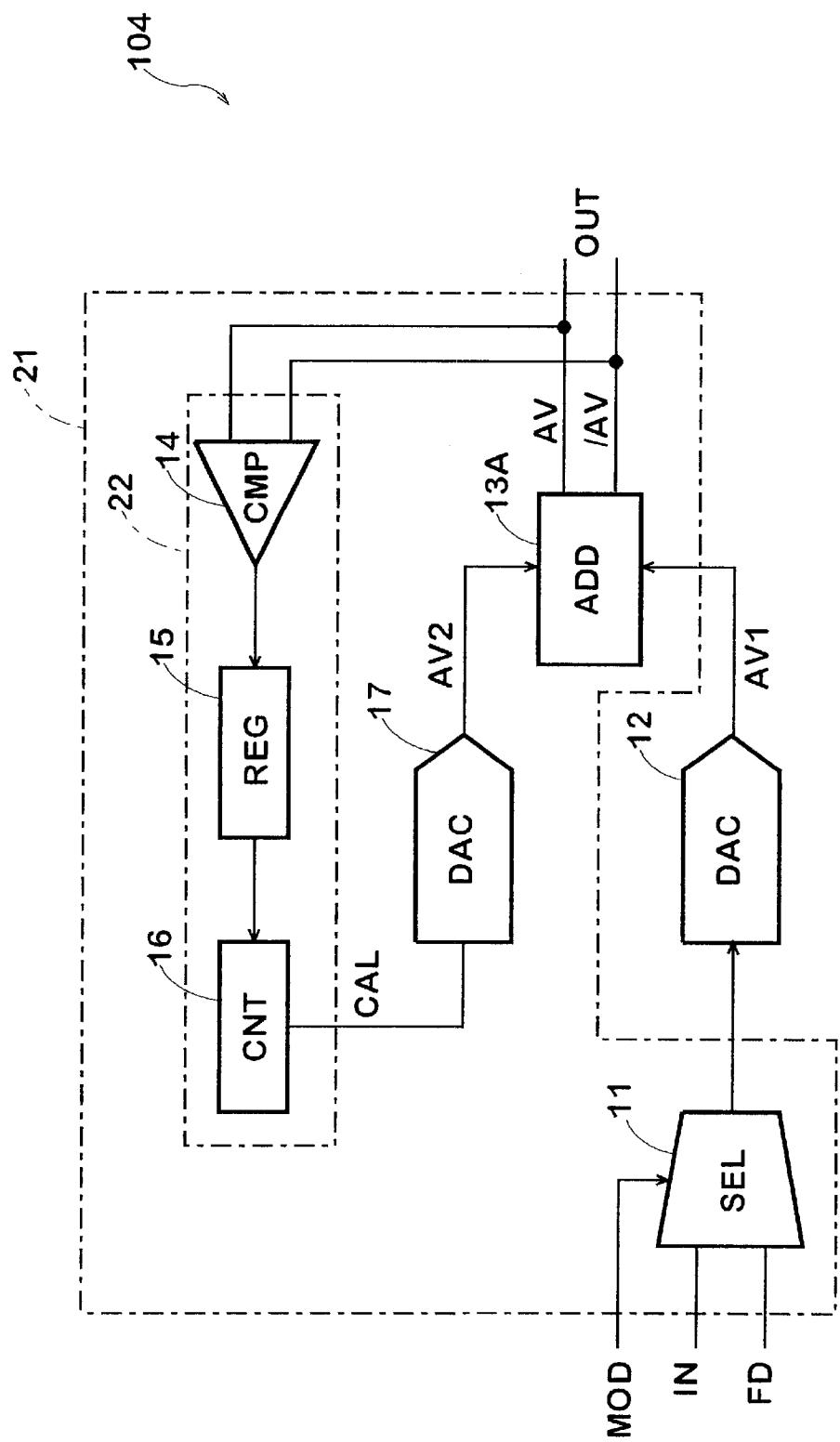
FIG. 5 is a block diagram of a DA converting circuit according to a fourth embodiment of the present invention.

FIG. 5 is a block diagram of the DA converting circuit 104 according to a fourth embodiment of the present invention, and the parts having the same functions as the parts of the DA converting circuit 101 in the first embodiment shown in FIG. 1 are designated by the common reference numerals.

The DA converting circuit 104 adopts an analog adder 13A with differential outputs in place of the analog adder 13 in the DA converting circuit 101 in the first embodiment.

The analog adder 13A, like the analog adder 13, is adapted to have two analog voltages (AV1 and AV2) applied to the first and the second input terminals. The analog adder 13A outputs a total voltage (AV) representing a result of addition of the two analog voltages, and simultaneously outputs the reciprocal voltage (/AV) in analog value that decreases reciprocally to an increase in analog value of a total voltage (AV) in performing a calibration. For example, in performing a calibration, as the total voltage (AV) progressively increases from 0 to Vcc, the reciprocal voltage (/AV) progressively decreases from Vcc to 0. More specifically, in the fourth embodiment, for the reference voltage applied to the comparator 14, the reciprocal voltage (/AV) is used which changes reciprocally to the total voltage (AV) output from the analog adder 13A.

The total voltage (AV) and the reciprocal voltage (/AV) are output as analog output signals (OUT), and are also applied respectively to the second and the first input terminals of the comparator 14. In other respects, this DA converting circuit 104 is identical with the DA converting circuit 101 in the first embodiment shown in FIG. 1.

The DA converting circuit 104 operates substantially in the same way as the DA converting circuit 101 in the first embodiment.

Note that in the operation in the setting mode (1) of the DA converting circuit 104, while the count value for use in calibration is increased sequentially, if at the comparator 14 the large-small relation of the values of a total voltage (AV) and a reciprocal voltage (/AV) inverts, the value of a binary signal output as a result of comparison at the comparator 14 changes.

The other operations in the DA converting circuit 104 are the same as in the DA converting circuit 101 in the first embodiment shown in FIG. 1.

In performing a calibration of the DA converting circuit 104 according to the fourth embodiment, the values of the total voltage (AV) and the reciprocal voltage (/AV) change reciprocally, for which reason, when the values coincide with each other, they are each substantially a half (Vcc/2) of the maximum value of the total voltage (AV).

The present invention is not limited to the embodiments described above, but various modifications and variations may be made in the present invention, some examples of which are shown in the following.

(a) The analog adders 13 used in the DA converting circuits 102 and 103, shown in FIGS. 3 and 4, may be replaced by an analog adder 13A, such as the one in the DA converting circuit 104 in the fourth embodiment shown in FIG. 5.

(b) The number of bits of each digital signal, the value of fixed data (FD), the fixed value (FX), that is, the first digital supplementary signal, external data (DTO), that is, the second supplementary signal, the reference voltage (VC), etc. are not limited to the figures shown in the embodiments.

(c) In performing the calibration, the controller 16 sequentially outputs the count values from level "0" to "255". Alternatively, the controller 16 may output the count values sequentially decreasing from level "255" to "0" to determine a correction value (CAL).

In the present invention, as described above, a digital input signal and a digital supplementary value to compensate for an offset are converted by the first and the second DA converters into analog voltages, and the analog voltages are added together by the analog adder. Thus, a digital-analog (digital-to-analog) converted value, which has an offset cancelled, is generated and an analog output voltage having this converted value is output.

Therefore, according to the present invention, DA conversion can be carried out with high precision without incurring deterioration in conversion precision by an overflow at the DA converter.

Further, it is possible to provide the second selector to selectively use a correction value internally generated to cancel an offset or a correction value externally generated to cancel an offset, and by using external data, it is possible to perform offset control from, for example, an outside processor for compensation of offset. Thus, the correction value can be modified suitably without a substantial interruption of the DA conversion operation.

Further, it is possible to provide a digital adder to add a value of the first or the second supplementary signal to a correction value. In the DA conversion operation, the second selector inputs the second supplementary signal of a very small value, and this supplementary signal is added to the correction value by the digital adder to make a fine adjustment of the correction value.

Further, for the reference value in the comparator, a reciprocal is used, which changes reciprocally to changes in the result of each addition by the analog adder, so that the zero point can be detected easily, making it possible to set an accurate offset correction value.

What is claimed is:

1. A digital-analog converting circuit, comprising:

a first digital-analog converter for outputting a first analog voltage corresponding to a value of a digital input signal, and a calibration mechanism for generating a correction signal to eliminate an offset related to a conversion operation of said first digital-analog converter, wherein said calibration mechanism includes a correction value setting section for generating a digital correction signal to eliminate said offset, a second digital-analog converter for converting said digital correction signal into a second analog voltage, an analog adder for adding said first and second analog voltages, and outputting a digital-analog converted value representing an addition result, and a first selector for selectively inputting said digital input signal, or a data signal for calibration work to generate said digital correction signal, to said first digital-analog converter, wherein said correction value setting section comprises a comparator that, when said data signal is selected by said first selector, compares output values from said analog adder with a reference value, and outputs a plurality of comparison results sequentially, a register for storing said plurality of comparison results, and a controller for transferring from said correction value setting section, instead of said correction signal, sequentially a plurality of count signals having progressively increasing or decreasing values to said second digital-analog converter to store said plurality of comparison results in said register.

2. A digital-analog converting circuit according to claim 1, wherein in said calibration work, said register sequentially stores said comparison results according to said count signals, and said controller obtains a correction value to eliminate said offset based on said count values when said comparison results stored in the register change, and in said conversion operation such that said digital input signal is selected by said first selector, said controller outputs a digital signal having said correction value as said correction signal to said second digital-analog converter.

3. A digital-analog converting circuit, comprising a first digital-analog converter for outputting a first analog voltage corresponding to a value of a digital input signal, and a calibration mechanism for generating a correction signal to eliminate an offset related to a conversion operation of said first digital-analog converter, wherein said calibration mechanism comprises a correction value setting section for generating a digital correction signal to eliminate said offset;

a second digital analog converter for converting said digital correction signal into a second analog voltage;

an analog adder for adding said first and second analog voltages, and outputting a digital-analog converted value representing an addition result;

a first selector for selectively inputting said digital input signal or a data signal for calibration work to generate said digital correction signal, to said first digital-analog converter, wherein said correction value setting section comprises a comparator that, when said data signal is selected by said first selector, compares output values from said analog adder with a reference value, and outputs comparison results sequentially, a register for storing said plurality of comparison results from said comparator, and a controller for sequentially transferring a plurality count signals instead of said correction signal, said count signals having progressively increasing or decreasing values to said second digital analog converter; and a second selector, located between said controller and said second digital-analog converter, selectively outputting said digital correction signal from said controller or an external digital correction signal input from outside as said correction value to said second digital-analog converter, wherein in said conversion operation, said second selector selects either said correction signal or said external correction signal.

4. A digital-analog converting circuit, comprising a first digital-analog converter for outputting a first analog voltage corresponding to a value of a digital input signal, and a calibration mechanism for generating a correction signal to eliminate an offset related to a conversion operation of said first digital-analog converter, wherein said calibration mechanism comprises a correction value setting section for generating a digital correction signal to eliminate said offset;

a second digital analog converter for converting said digital correction signal into a second analog voltage;

an analog adder for adding said first and second analog voltages, and outputting a digital-analog converted value representing an addition result;

a first selector for selectively inputting said digital input signal or a data signal for calibration work to generate said digital correction signal to said first digital-analog converter, wherein said correction value setting section comprises a comparator that, when said data signal is selected by said first selector, compares output values from said analog adder with a reference value, and outputs a plurality of comparison results sequentially, a register for storing said plurality of comparison results, and a controller for sequentially transferring a plurality of count signals, instead of said correction signal, having progressively increasing or decreasing values to said second digital analog converter;

a second selector for selectively outputting a first digital supplementary signal input from outside to modify said digital correction signal or a second digital supplementary signal having a value different from said first supplementary signal; and a digital adder, located between said controller, said second selector and said second digital-analog converter, for adding a digital output value from said second selector and a digital output value from said controller, and outputting a result of the digital addition to said second digital-analog converter, wherein, in said calibration work, said digital adder sequentially outputs a result of addition of each value of said plurality of count signals and value of said first supplementary signal to said second converter, and when correcting the value of said digital correction signal, outputs a result of addition of values of said correction signal and said second supplementary signal to said second digital-analog converter.

5. A digital-analog converting circuit according to claim 4, wherein said first digital supplementary signal has a value of level "0" to substantially invalidate the addition function of said digital adder, and said second digital supplementary signal has a value to finely adjust the value of said digital correction signal.

6. A digital-analog converting circuit, comprising a first digital-analog converter for outputting a first analog voltage corresponding to a value of a digital input signal, and a calibration mechanism for generating a correction signal to eliminate an offset related to a conversion operation of said first digital-analog converter, wherein said calibration mechanism comprises a correction value setting section for generating a digital correction signal to eliminate said offset;

a second digital analog converter for converting said digital correction signal into a second analog voltage;

an analog adder for adding said first and second analog voltages, and outputting a digital-analog converted value representing an addition result;

a first selector for selectively inputting said digital input signal or a data signal for calibration work to generate said digital correction signal to said first digital-analog converter, wherein said correction value setting section comprises a comparator that, when said data signal is selected by said first selector, compares output values from said analog adder with a reference value, and outputting comparison results sequentially, a register for storing said plurality of comparison results from said comparator, and a controller for sequentially transferring a plurality count signals, instead of said correction signal, having progressively increasing or decreasing value to said second digital analog converter; and wherein, when said analog adder outputs said addition result, said analog adder further outputs to said comparator as said reference value an analog reciprocal or differential value, having a value reciprocal to said addition result at said analog adder, wherein in said calibration work, the reciprocal value changes reciprocally to changes in said addition result, and wherein said comparator outputs comparison results between a plurality of the addition results having progressively decreasing or increasing values and a plurality of reciprocals of said addition results changing reciprocally to said addition results.

7. A digital-analog converting circuit, comprising:

a first digital-analog converter for outputting a first analog voltage corresponding to a value of a digital input signal;

a calibration circuit for generating a correction signal to eliminate an offset related to a conversion operation of said first digital-analog converter, wherein said calibration circuit includes a correction value setting section for generating a digital correction signal to eliminate said offset, a second digital-analog converter for converting said digital correction signal into a second analog voltage, and an analog adder for adding said first and second analog voltages, and outputting a digital-analog converted value representing an addition result;

a first selector for selectively inputting said digital input signal, or a data signal for calibration work to generate said digital correction signal, to said first digital-analog converter, wherein said correction value setting section comprises a controller for transferring from said correction value setting section, instead of said digital correction signal, sequentially a plurality count signals to said second digital-analog converter, said count signals having progressively increasing or decreasing values; and a second selector, located between said controller and said second digital-analog converter, selectively outputting said digital correction signal from said controller or an external digital correction signal input from outside as said correction value to said second digital-analog converter, wherein in said conversion operation, said second selector selects either said correction signal or said external correction signal.

8. A digital-analog converting circuit, comprising:

a first digital-analog converter for outputting a first analog voltage corresponding to a value of a digital input signal;

a calibration circuit for generating a correction signal to eliminate an offset related to a conversion operation of said first digital-analog converter, wherein said calibration circuit includes a correction value setting section for generating a digital correction signal to eliminate said offset, and a second digital-analog converter for converting said digital correction signal into a second analog voltage, and an analog adder for adding said first and second analog voltages, and outputting a digital-analog converted value representing an addition result;

a first selector for selectively inputting said digital input signal, or a data signal for calibration work to generate said digital correction signal, to said first digital-analog converter, wherein said correction value setting section comprises a controller for sequentially transferring from said correction value setting section, instead of said correction signal, a plurality of count signals having progressively increasing or decreasing values, to said second digital-analog converter;

a second selector for selectively outputting a first digital supplementary signal input from outside to modify said digital correction signal or a second digital supplementary signal having a value different from said first supplementary signal; and a digital adder, located between said controller, said second selector and said second digital-analog converter, for adding a digital output value from said second selector and a digital output value from said controller, and outputting a result of the digital addition to said second digital-analog converter, wherein, in said calibration work, said digital adder sequentially outputs a result of addition of each value of said plurality of count signals and value of said first supplementary signal to said second converter, and when correcting the value of said digital correction signal, outputs a result of addition of values of said correction signal and said second supplementary signal to said second digital-analog converter.

9. A digital-analog converting circuit comprising:

a first digital-analog converter for outputting a first analog voltage corresponding to a value of a digital input signal;

a calibration circuit for generating a correction signal to eliminate an offset related to a conversion operation of said first digital-analog converter, wherein said calibration circuit includes a correction value setting section for generating a digital correction signal to eliminate said offset, a second digital-analog converter for converting said digital correction signal into a second analog voltage, and an analog adder for adding said first and second analog voltages, and outputting a digital-analog converted value representing an addition result;

a first selector for selectively inputting said digital input signal, or a data signal for calibration work to generate said digital correction signal, to said first digital-analog converter, wherein said correction value setting section comprises a controller for sequentially transferring from said correction value setting section, instead of said correction signal, a plurality of count signals having progressively increasing or decreasing values, to said second digital-analog converter;

a second selector for selectively outputting a first digital supplementary signal input from outside to modify said digital correction signal or a second digital supplementary signal having a value different from said first supplementary signal; and a digital adder, located between said controller, said second selector and said second digital-analog converter, for adding a digital output value from said second selector and a digital output value from said controller, and outputting a result of the digital addition to said second digital-analog converter, wherein for correcting the value of said digital correction signal said digital adder outputs a result of addition of values of said correction signal and said second supplementary signal to said second digital-analog converter.

10. A digital-analog converting circuit, comprising:

a first digital-analog converter for outputting a first analog voltage corresponding to a value of a digital input signal; and a calibration circuit for generating a correction signal to eliminate an offset related to a conversion operation of said first digital-analog converter, wherein said calibration circuit includes a correction value setting section for generating a digital correction signal to eliminate said offset, a second digital-analog converter for converting said digital correction signal into a second analog voltage, and an analog adder for adding said first and second analog voltages, and outputting a digital-analog converted value representing an addition result;

a first selector for selectively inputting said digital input signal, or a data signal for calibration work to generate said digital correction signal, to said first digital-analog converter, wherein said correction value setting section comprises a controller for sequentially transferring from said correction value setting section, instead of said correction signal, a plurality of count signals having progressively increasing or decreasing values, to said second digital-analog converter;

a second selector for selectively outputting a first digital supplementary signal input from outside to modify said digital correction signal or a second digital supplementary signal having a value different from said first supplementary signal; and a digital adder, located between said controller, said second selector and said second digital-analog converter, for adding a digital output value from said second selector and a digital output value from said controller, and outputting a result of the digital addition to said second digital-analog converter, wherein, in said calibration work, said digital adder sequentially outputs a result of addition of each value of said plurality of count signals and value of said first supplementary signal to said second converter.

11. A digital-analog converting circuit, comprising:

a first digital-analog converter for outputting a first analog voltage corresponding to a value of a digital input signal; and a calibration circuit for generating a correction signal to eliminate an offset related to a conversion operation of said first digital-analog converter, wherein said calibration circuit includes a correction value setting section for generating a digital correction signal to eliminate said offset, a second digital-analog converter for converting said digital correction signal into a second analog voltage, and an analog adder for adding said first and second analog voltages, and outputting a digital-analog converted value representing an addition result;

a first selector for selectively inputting said digital input signal, or a data signal for calibration work to generate said digital correction signal, to said first digital-analog converter, wherein said correction value setting section comprises a controller for sequentially transferring from said correction value setting section, instead of said correction signal, a plurality of count signals having progressively increasing or decreasing values, to said second digital-analog converter;

a first selector for selectively inputting said digital input signal, or a data signal for calibration work to generate said digital correction signal, to said first digital-analog converter, wherein said correction value setting section comprises a controller for transferring from said correction value setting section to said second digital-analog converter, instead of said correction signal, sequentially a plurality of count signals having progressively increasing or decreasing values, a second selector for selectively outputting a first digital supplementary signal input from outside to modify said digital correction signal or a second digital supplementary signal having a value different from said first supplementary signal, and a digital adder, located between said controller, said second selector and said second digital-analog converter, for adding a digital output value from said second selector and a digital output value from said controller, and outputting a result of the digital addition to said second digital-analog converter.

12. A digital-analog converting circuit, comprising:

a first digital-analog converter for outputting a first analog voltage corresponding to a value of a digital input signal;

a calibration circuit for generating a correction signal to eliminate an offset related to a conversion operation of said first digital-analog converter, wherein said calibration circuit includes a correction value setting section for generating a digital correction signal to eliminate said offset, a second digital-analog converter for converting said digital correction signal into a second analog voltage, and an analog adder for adding said first and second analog voltages, and outputting a digital-analog converted value representing an addition result; and a selector for selectively inputting said digital input signal, or a data signal for calibration work to generate said digital correction signal, to said first digital-analog converter, wherein said correction value setting section comprises
- a comparator that, when said data signal is selected by said first selector, compares output values from said analog adder with a reference value, and outputting comparison results sequentially,
- a register for storing said plurality of comparison results from said comparator, and
- a controller for transferring from said correction value setting section, instead of said correction signal, sequentially a plurality count signals having progressively increasing or decreasing value, to said second digital-analog converter; and wherein, when said analog adder outputs said addition result, said analog adder further outputs to said comparator as said reference value an analog reciprocal or differential value, having a value reciprocal to said addition result at said analog adder, wherein in said calibration work, the reciprocal value changes reciprocally to changes in said addition result, and wherein said comparator outputs comparison results between a plurality of the addition results having progressively decreasing or increasing values and a plurality of reciprocals of said addition results changing reciprocally to said addition result.

13. A digital-analog converting circuit, comprising:

a first digital-analog converter for outputting a first analog voltage corresponding to a value of a digital input signal;

a calibration circuit for generating a correction signal to eliminate an offset related to a conversion operation of said first digital-analog converter, wherein said calibration circuit includes
- a correction value setting section for generating a digital correction signal to eliminate said offset,
- a second digital-analog converter for converting said digital correction signal into a second analog voltage, and
- an analog adder for adding said first and second analog voltages, and outputting a digital-analog converted value representing an addition result; and a selector for selectively inputting said digital input signal, or a data signal for calibration work to generate said digital correction signal, to said first digital-analog converter, wherein said correction value setting section comprises a controller for transferring from said correction value setting section to said second digital-analog converter, instead of said correction signal, sequentially a plurality count signals having progressively increasing or decreasing value, wherein, when said analog adder outputs said addition result, said analog adder further outputs an analog reciprocal or differential value, having a value reciprocal to said addition result at said analog adder, and wherein in said calibration work, the reciprocal value changes reciprocally to changes in said addition result.

* * * * *